US005288569A

United States Patent [19]

Lin

[11] Patent Number: 5,288,569
[45] Date of Patent: Feb. 22, 1994

[54] FEATURE BIASSING AND ABSORPTIVE PHASE-SHIFTING TECHNIQUES TO IMPROVE OPTICAL PROJECTION IMAGING

[75] Inventor: Burn J. Lin, Austin, Tex.

[73] Assignee: International Business Machines Corporation, Armonk, N.Y.

[21] Appl. No.: 872,784

[22] Filed: Apr. 23, 1992

[51] Int. Cl.$^5$ .............................................. G03F 9/00
[52] U.S. Cl. ...................................... 430/5; 430/311; 430/396
[58] Field of Search ............................ 430/5, 311, 396

[56] References Cited

U.S. PATENT DOCUMENTS

| | | | |
|---|---|---|---|
| 3,743,842 | 7/1973 | Smith et al. | 250/320 |
| 4,360,586 | 11/1982 | Flanders et al. | 430/321 |
| 4,890,309 | 12/1989 | Smith et al. | 378/35 |
| 5,045,417 | 9/1991 | Okamoto | 430/5 |

OTHER PUBLICATIONS

Burn Jeng Lin, "Partially Coherent Imaging in Two Dimensions and the Theoretical Limits of Projection Printing in Microfabrication" IEEE Transactions on Electron Devices, vol. ED-27, No. 5, pp. 931–937 (May 1980).

Burn Jeng Lin, "A Comparison of Projection and Proximity Printings—From UV to X-Ray"; Microelectronic Engineering 11 (1990) pp. 137–145.

Primary Examiner—Marion E. McCamish
Assistant Examiner—Mark A. Chapman
Attorney, Agent, or Firm—Graham S. Jones, II

[57] ABSTRACT

Feature biassing applied to phase shifting masks is used to improve the exposure latitude and depth of focus of an optical projection imaging system. Making the phase shifters absorptive facilitates a phase shifting mask system for arbitrary layouts. Combining phase shifters of different levels of absorption further enhance the improvements. Even more enhancement can be gained by combining biassing with absorption levels.

22 Claims, 14 Drawing Sheets

FEATURE BIASSING AND ABSORPTIVE PHASE-SHIFTING TECHNIQUES TO IMPROVE OPTICAL PROJECTION IMAGING

BACKGROUND OF THE INVENTION

1. Field of the Invention

This invention relates to masks for lithography and more particularly to phase-shift masks for use in photolithography.

2. Description of Related Art

In photolithography, masks are employed to expose a pattern upon a work piece. As manufacturing requirements call for exposure of patterns with smaller and smaller dimensions, it is becoming necessary to employ techniques which permit enhancement of the current performance of the process of photolithography. One trend has been to use electromagnetic energy with shorter wavelengths in the UV wavelengths, x-rays and the like. An alternative approach is to use phase-shifting techniques in the ranges of wavelengths used in photolithography in the past.

The phase-shifting technique can improve the resolution of coherent or partially coherent optical imaging systems. It has been shown that the normalized resolution $k_1$ can be reduced from 0.7 to 0.35 to improve lithography by two generations.

Use of phase shifting techniques with masks in optical microlithography systems has been shown to improve projected images. These phase-shifting techniques have been practiced in various configurations.

Figure 1A:
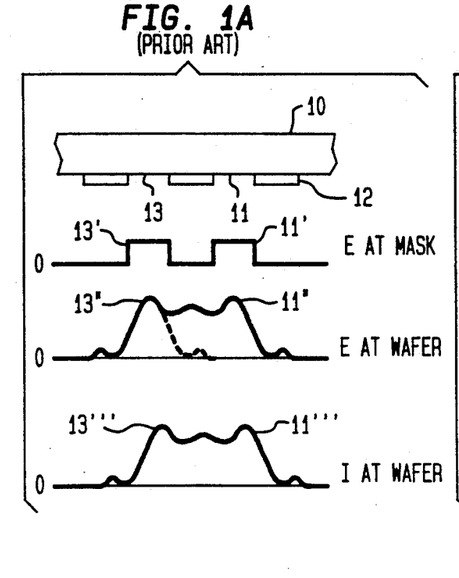
FIGS. 1A and 1B show a prior art alternative-element phase-shifting method which involves shifting every other one of the adjacent transparent elements.
Figure 1B:
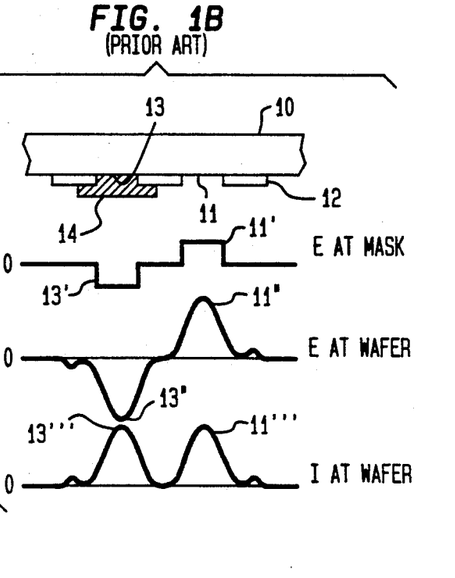

FIGS. 1A and 1B illustrate the alternative-element (Alt) phase-shifting method which involves shifting every other one of the adjacent transparent elements. FIG. 1A shows a binary intensity mask (BIM) and FIG. 1B shows a phase-shifting mask (PSM). In particular, in both FIG. 1A and FIG. 1B the glass 10 is coated with an array of chrome elements 12 separated by spaces 11 and 13. In FIG. 1B, a phase-shifter layer 14 is deposited in space 13 between two adjacent ones of the elements 12 upon the exposed glass 10 leaving an exposed space 11 in the other space between the adjacent elements 12. It can be seen that the value of E, the amplitude of the electric field of the electromagnetic radiation, at both the mask and the wafer is reversed to a negative value beneath the phase-shifter layer 14 in FIG. 1B from that in the corresponding position in FIG. 1A. In FIG. 1B, the intensity I of portions of the curves at 11''' and 13''' at the wafer is significantly changed in that the contrast is enhanced beneath the two spaces 11 and 13. The values of the electric field E at the mask 11' and 13' are beneath the spaces 11 and 13 as are the values 11'' and 13'' for the electric field E at the wafer.

Figure 2A:
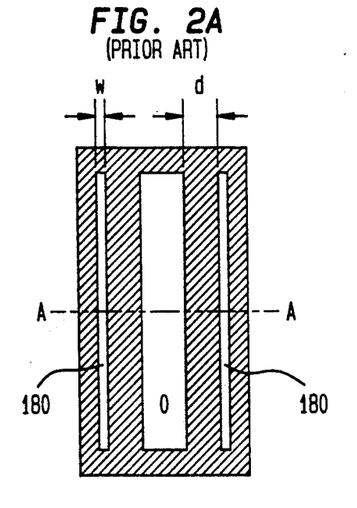
FIGS. 2A and 2B show an alternative prior art design involves addition of subresolution elements to isolated transparent features as shown in FIGS. 2A and 2B FIGS. 3A–3D show a prior art design using rim phase shifting.
Figure 2B:
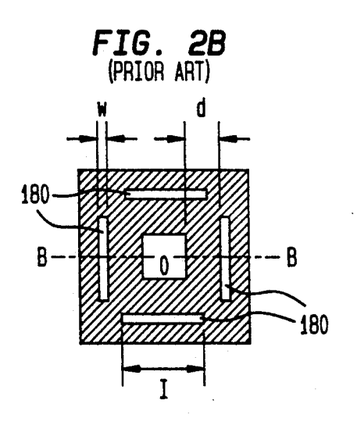
Figure 3A:
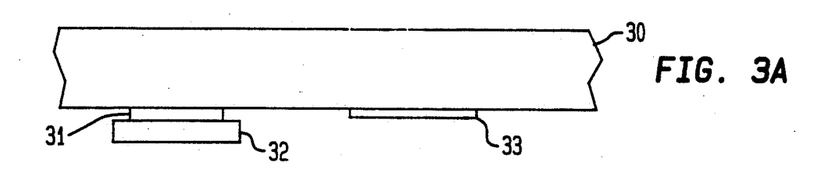
FIG. 3A shows a conventional absorber side-by-side with an elevated phase-shifter supported by slightly smaller self-aligned absorbers.
Figure 3B:
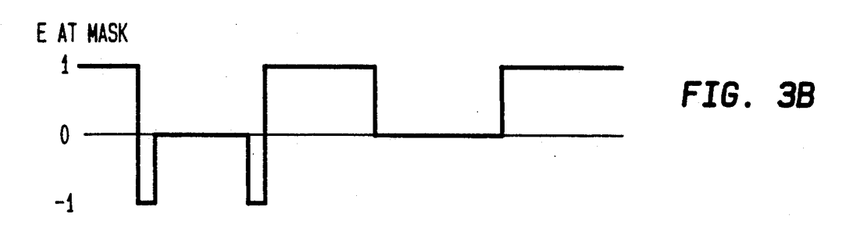
FIGS. 3B and 3C show respectively show the field at the mask and the intensity at the wafer for the structures of FIG. 3A.
Figure 3C:
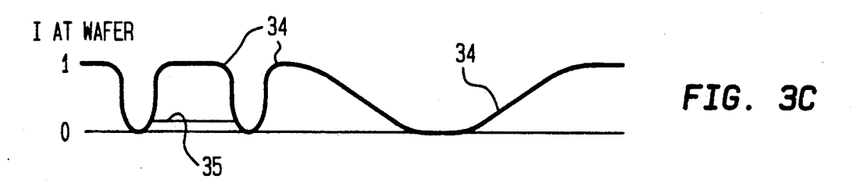
Figure 4A:
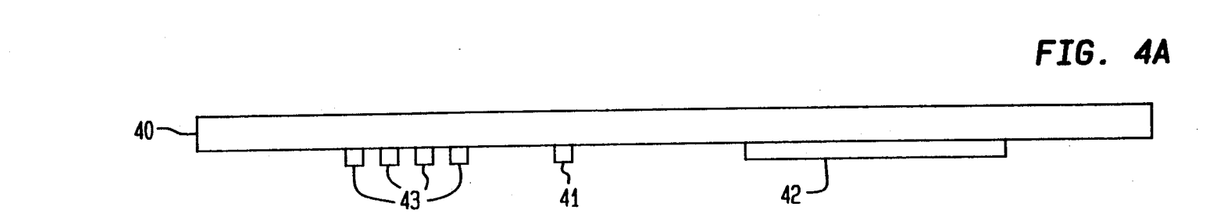
FIG. 4A shows a prior art unattenuated PSM mask design using unattenuated phase shifting.
Figure 4B:
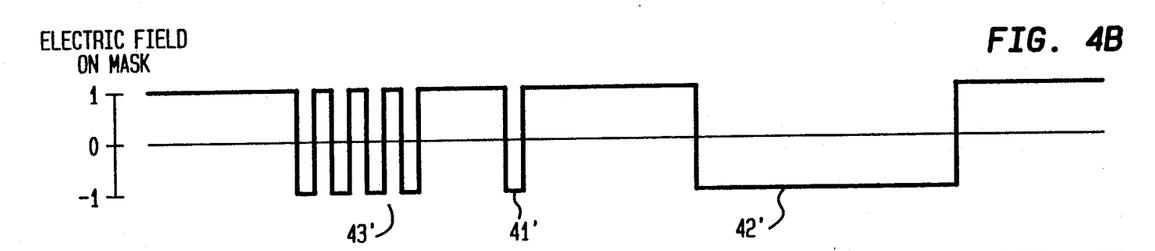
FIGS. 4B–4D show electric fields and intensity for the mask design of FIG. 4A.
Figure 4C:
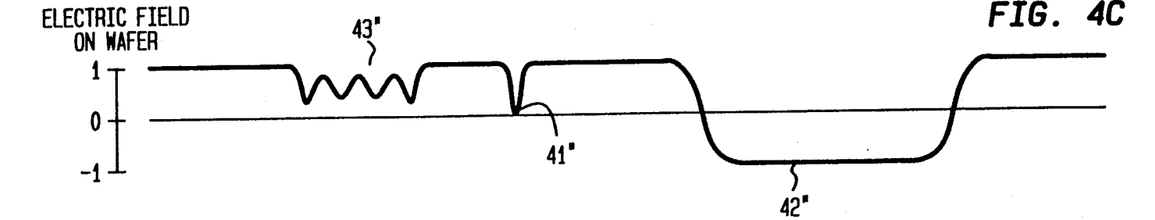
Figure 4D:
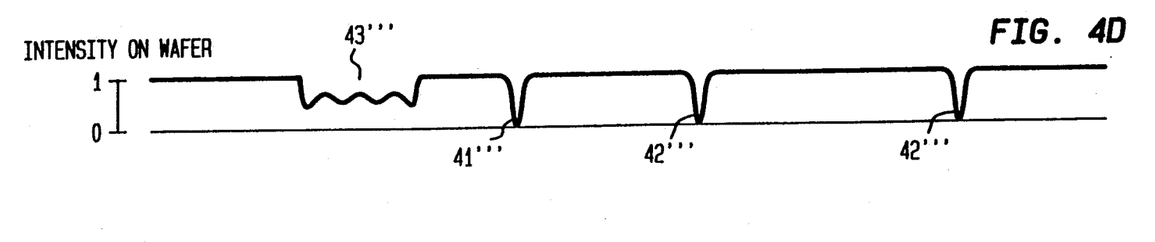

Another prior art design, called Subresolution-assisted (SA) PSM involves addition of phase-shifted subresolution elements to isolated transparent features as shown in FIGS. 2A and 2B. Both techniques suffer from not being applicable to an arbitrary mask layout which consists of many features other than closely packed or isolated transparent features. FIG. 3A shows a substrate 30 carrying an absorber 31 carrying a phase-shifter 32 beyond the absorber 31. We refer below to the technique employed here using a projection beyond the absorber as the rim PSM technique. If the absorber 31 were not used, phase shifter light of a large negative amplitude creates unwanted bright images. The absorber 31 blocks the unwanted part of the phase-shifted light to eliminate the unwanted bright spots at the center of the phase-shifted features. On the right side of FIG. 3A, a conventional absorber 33 is shown adjacent to the absorber 31. FIGS. 3B and 3C are aligned with FIG. 3A to show the relative results of the differences in the masks on the left and right. FIG. 3B shows the electric field E at the mask for the structure of FIG. 3A.

FIG. 3C shows the intensity at the wafer for the structure of FIG. 3A. Curve 34 shows what the intensity I would be without absorber 31. Curve 35 shows how it is reduced below blocker 31, with no change elsewhere.

This rim PSM technique applies to all features on any mask. However, optical proximity effects are enhanced. That is, the different features now require a larger difference in exposure to print the same feature size with an identical tolerance, as shown in the Exposure-Defocus (E-D) diagrams of $k_2$ as a function of exposure dosage drawn in log scale in FIG. 5 which relate to teachings in an article by Burn J. Lin, "Partially Coherent Imaging in Two Dimensions and the Limits of Projection Printing in Microfabrication", IEEE Transactions on Electron Devices, Vol. ED-27, pp. 931–938 (1980) and Burn Jeng Lin, "A Comparison of Projection and Proximity Printings—From UV to X-ray" Microelectronic Engineering Vol. 11, (1990), pp. 137–145.

Yet another prior art design is shown in FIG. 4 where there is no absorber. Only the phase shifter 41, 42, 43 on substrate 40 carry the burden of patterning. The large phase shifter areas 42 are printed everywhere inside and outside the features except at the edge, where due to the large phase transition, large dark line images 42''' are produced. In the small areas 41, the edges are sufficiently close to each other so that a completely dark feature 41''' is created. Large dark images 43''' can be produced by grouping many subresolution phase shifter features 43 closely together. Here, because the phase shifters are completely transparent as opposed to the attenuated PSM to be described in the invention, this particular PSM system is called unattenuated (Utt) PSM.

The problem solved by this invention is that poor image contrast and shallow depth of focus result when steppers ar used beyond their limits.

BRIEF DESCRIPTION OF THE DRAWINGS

FIG. 6A shows an absorbed and phase-shifted element next to a conventional element.

DESCRIPTION OF THE PREFERRED EMBODIMENT

Figure 6A:
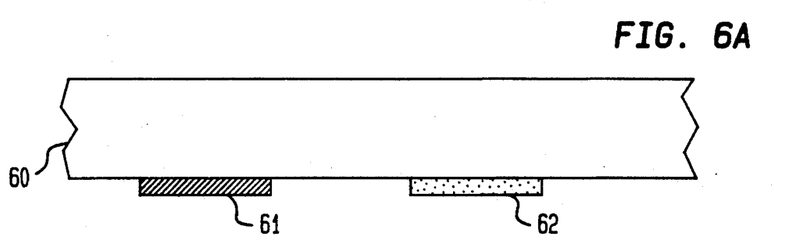
FIG. 6A shows the Att PSM.
Figure 6B:
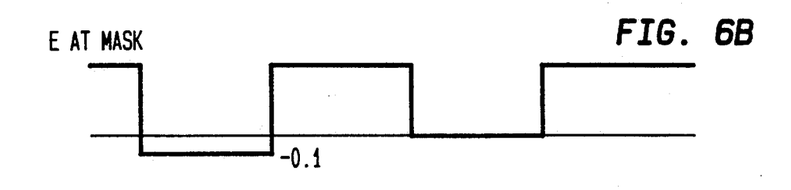
FIG. 6B shows its electric field amplitude and FIG. 6C shows the image intensity for FIG. 6A.
Figure 6C:
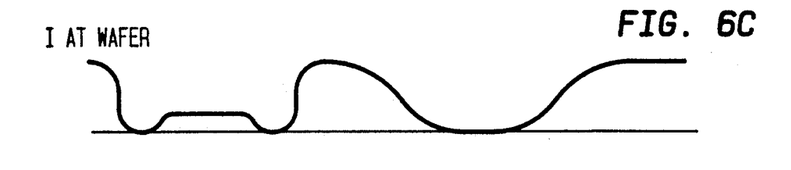

This invention provides a better technique for globally improving all features on a mask. The conventional opaque absorber is made transmissive and an extra make-up phase-shifting layer is added on to the mask so that the total phase-shift through the film stack when referenced to the phase-shift through an air path of the same thickness is $\pi$ or $(2n+1)\pi$ where n is any positive or negative integer. According to theoretical calculations, the improvement is most pronounced with the transmitted electric field amplitude between 10% and 50%, i.e., the intensity transmission of the stack should lie between 1% and 25%. Its operation principle is shown in FIG. 6A-6C. FIG. 6A shows the Att PSM. Mask substrate 60 carries an absorbed and phase-shifted element 61 next to a conventional opaque element 62. FIG. 6B shows the electric field amplitude at the mask of FIG. 6A, and FIG. 6C shows the image intensity at the wafer for FIG. 6A. The amplitude in the absorbed part 61 now becomes negative to help improve the image contrast. If the transmission is too low, the negative amplitude is too small to be effective. At the other extreme, too much light is transmitted through an area that is required to be dark, resulting in ghost images.

Figure 7A:
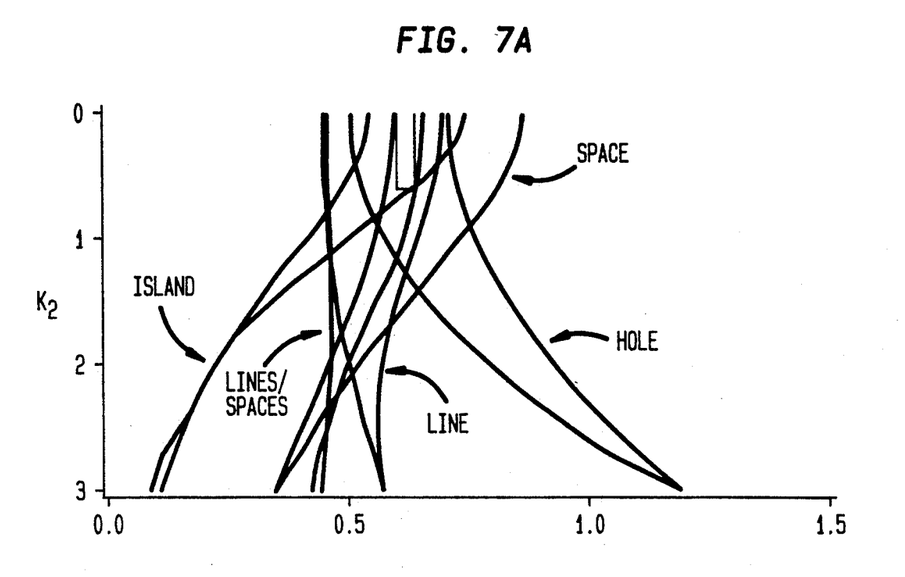
FIGS. 7A and 7B show the common E-D window of BIM and Attenuation (Att) PSM in the form of E-D diagrams showing improvements in contrast and ($k_2$) by Att PSM where $k_2$ is normalized depth-of-focus (DOF) defined by $Z(NA^2/Lambda)$, with Z being a physical DOF, Lambda the actinic wavelength, and NA the numerical aperture of the imaging lens.
Figure 7B:
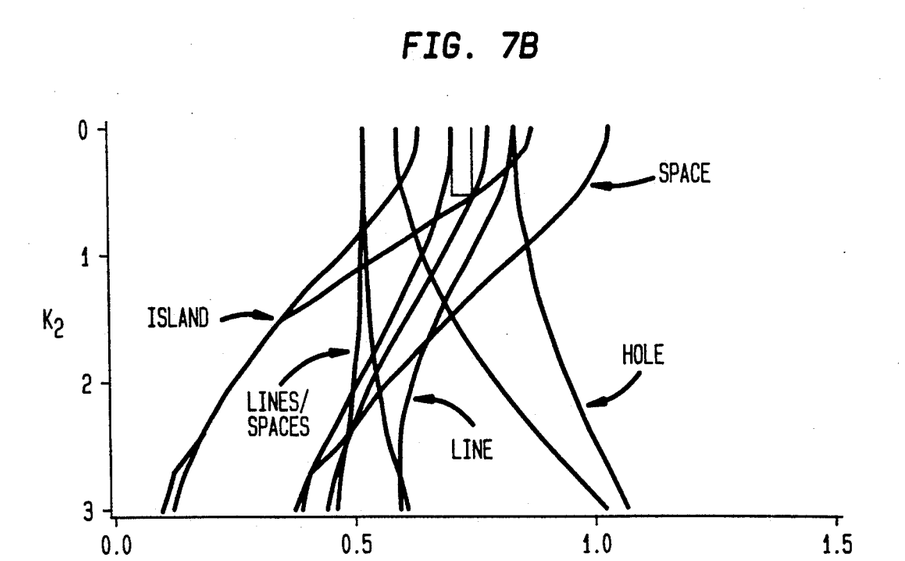

The Exposure Defocus (E-D) diagrams in FIGS. 7A and 7B show individual improvements in contrast and in the normalized DOF, $k_2$ as a function of LOG Exposure. Even though the DOF defined by the common E-D regions is smaller with attenuated phase-shifting (Att), improvements in contrast and DOF are seen in the following combinations:

lines-line/space,
lines-line/space-holes, and
holes-islands.

When the critical features on a mask are on these combinations, attenuated phase-shifting improves feature size control.

Figure 8:
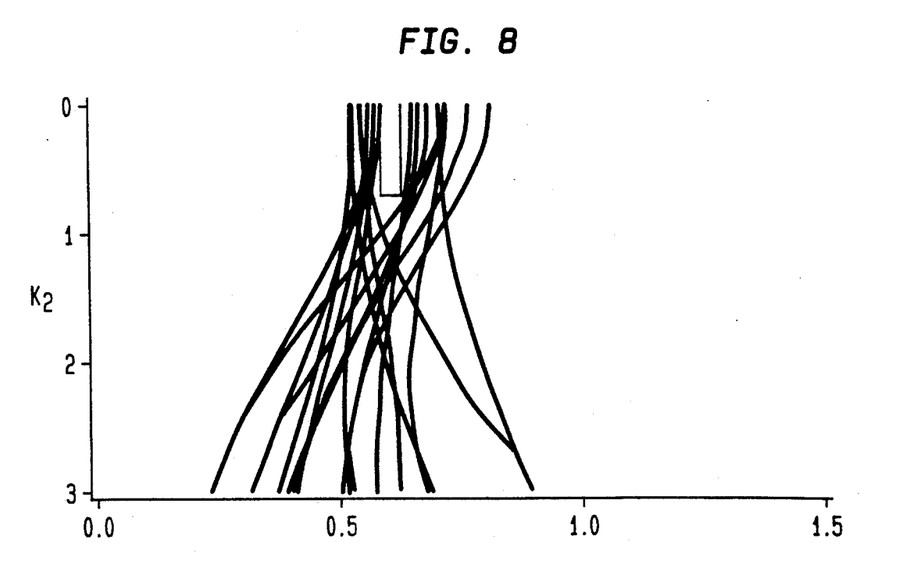
FIG. 8 shows the common E-D window of Att PSM consisting of three feature sizes and types. The absorber of the entire mask is replaced with a 25% amplitude transmission phase absorber while the isolated spaces remain opaque.

In addition to a uniform attenuating phase-shifting layer, the attenuation can be varied to further improve the image. FIG. 8 shows that when the critical features are equal lines and spaces, isolated lines and isolated spaces, the absorber of the entire mask can be replaced with a 25% amplitude transmission phase absorber while the isolated spaces remain opaque. This facilitates a resolution of $k_1=0.46$ while providing depth of focus of $k_2=0.81$. Three feature sizes, $k_1=0.46$, 0.58, and 0.7 are included for each of the three feature types. All feature sizes and types are controlled to ±0.046 in feature size tolerance. The resolution and DOF are given in normalized terms, $k_1$ and $k_2$. They can be converted to physical dimensions by $$W = k_1 ((L))/NA, \text{ and}$$

$$DOF = k_2 ((L))/NA^2)$$

W—feature size $k_1$—Normalized width parameter $k_2$—Normalized depth parameter (L))—Wavelength (Angstroms)

NA—Numerical Aperture

DOF—Depth of focus

Figure 9A:
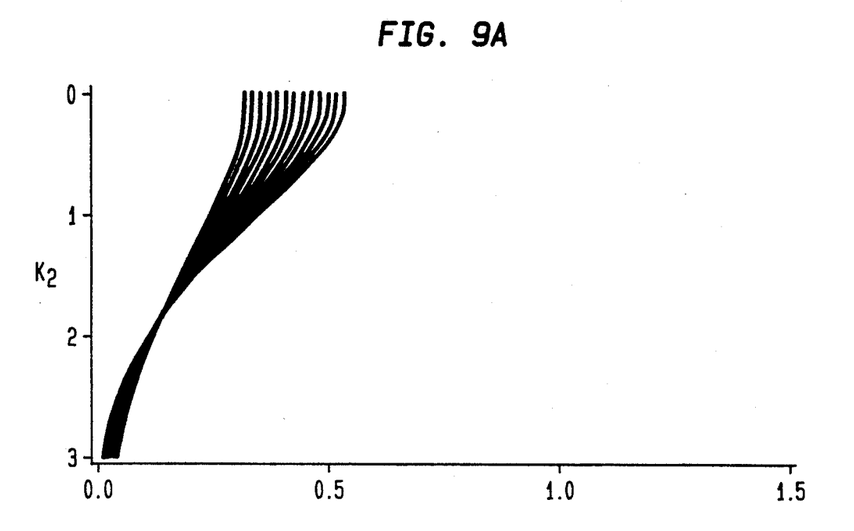
FIGS. 9A-9D show changes of the E-D tree of isolated phase shifted features as a function of the transmission of the phase shifters. These E-D diagrams show the change of contrast and exposure level as the amplitude transmission is varied from 0 to 25%, 50%, and 100%, corresponding to absorption of 100%, 93.75%, 75%, and 0%.
Figure 9B:
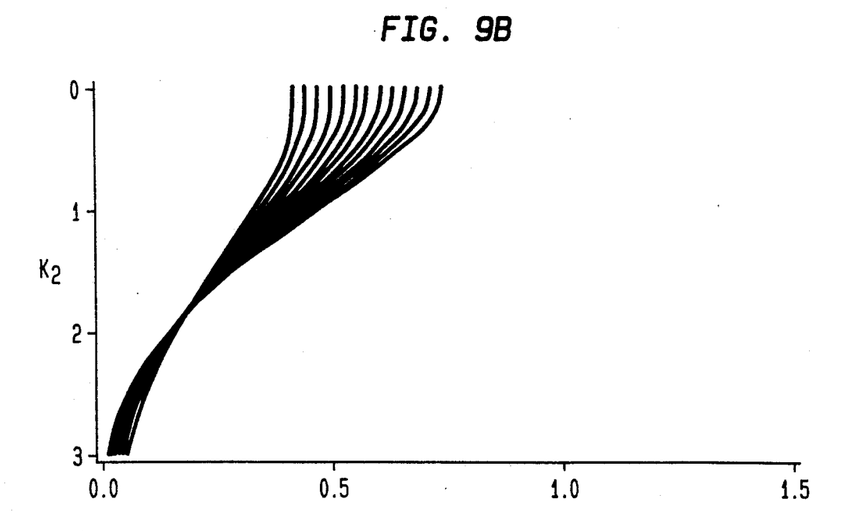
Figure 9C:
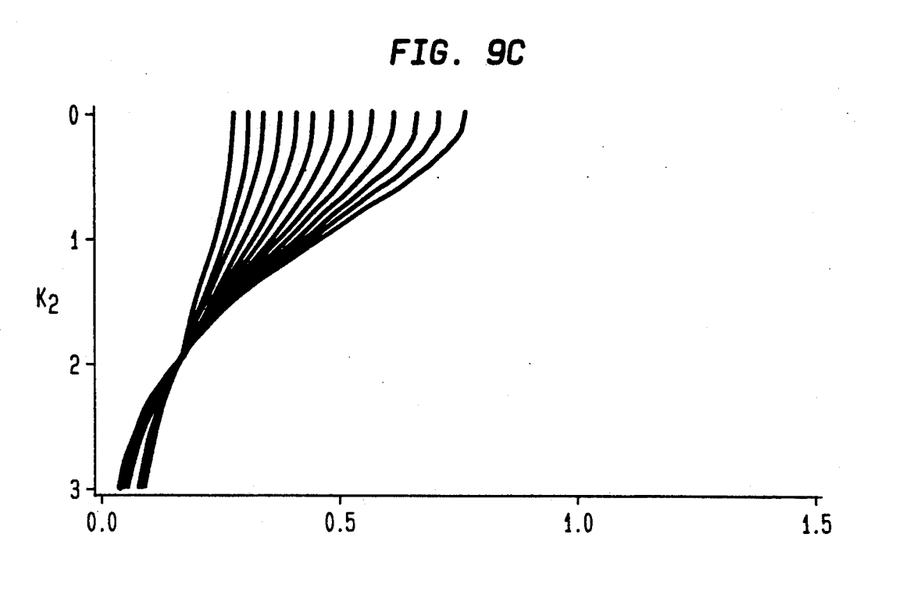
Figure 9D:
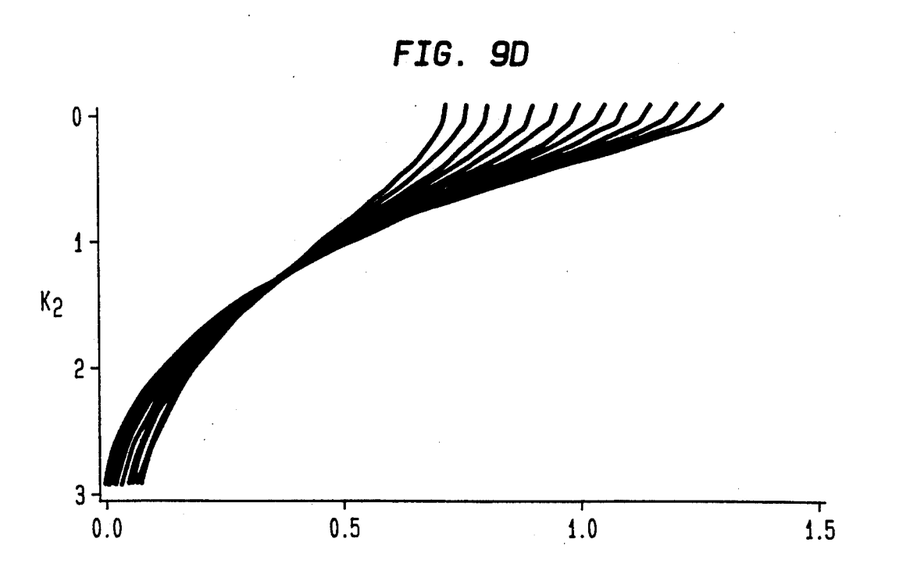
Figure 9E:
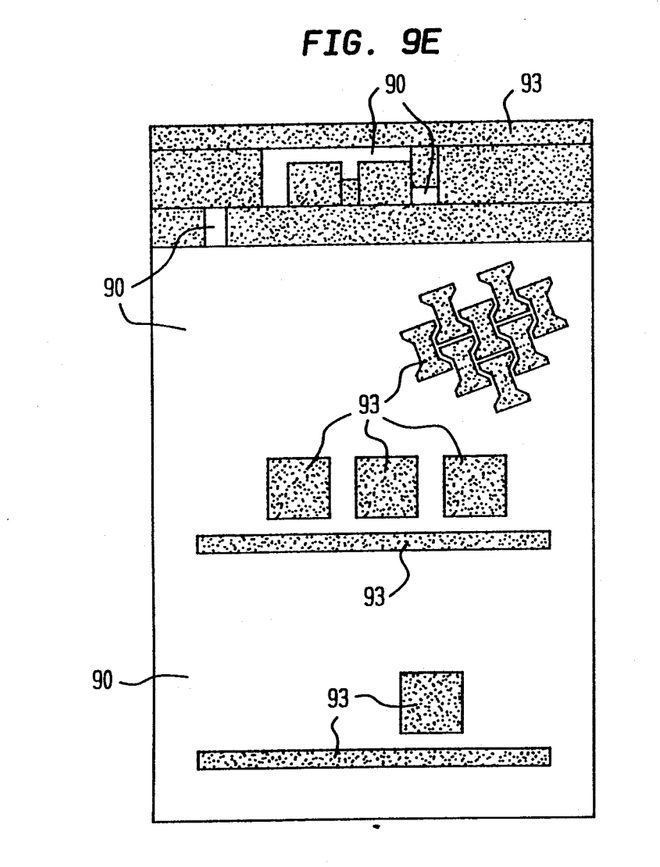
FIG. 9E shows the layout of a BIM.
Figure 9F:
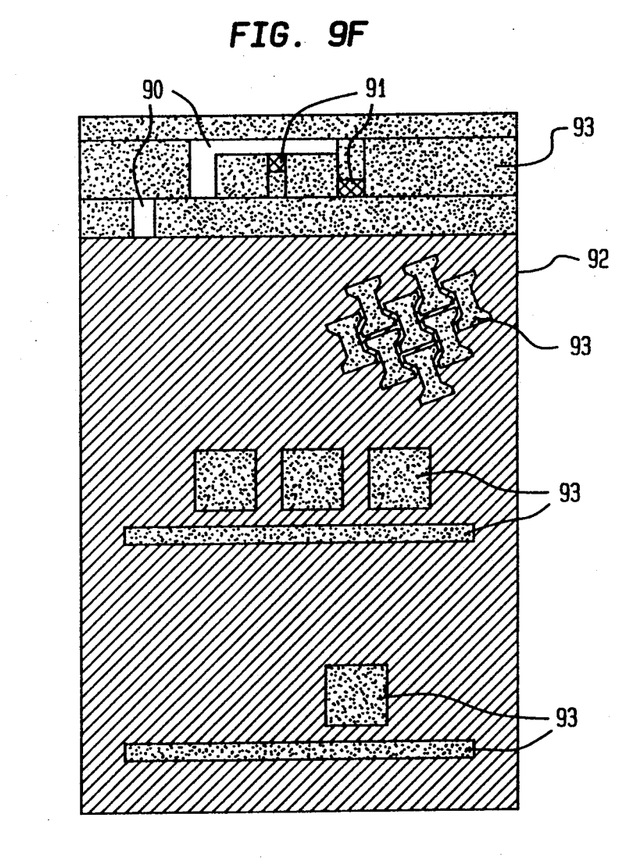
FIG. 9F shows the layout of a PSM consisting of three levels of absorption, of which, one is opaque.

When the critical feature is an opaque island, the transmission in the absorptive phase-shifting layer can be increased to improve the contrast of these images and to move the required exposure dosage towards the common zone of the other features. The E-D diagrams in FIGS. 9A, 9B, 9C and 9D show the change of contrast and exposure level as the amplitude transmission is varied from 0 to 25%, 50%, and 100%, corresponding to absorption of 100%, 93.75%, 75%, and 0%. FIG. 9E shows the layout of an intensity mask. FIG. 9F gives an example of a similar layout of a phase-shifting mask. In FIG. 9E, there is but one level of absorption, comprising opaque areas 90. Areas 93 are openings in the mask. In FIG. 9F there are three levels of absorption, of which, one is opaque as shown by areas 90. There are two absorptive-phase shift areas, area one 91 and area two 92. Then there are the transparent areas 93.

Figure 10A:
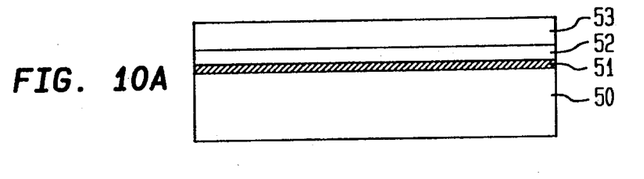
FIG. 10A-10D show the fabrication process of a shifter-on-absorber Att PSM.
Figure 10B:
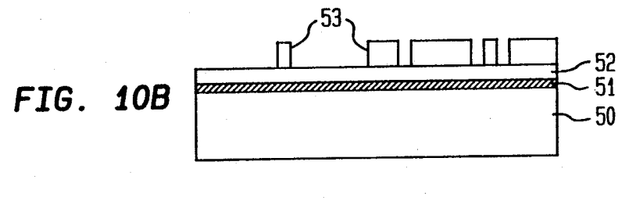
Figure 10C:
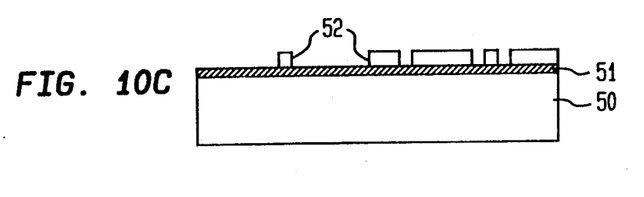
Figure 10D:
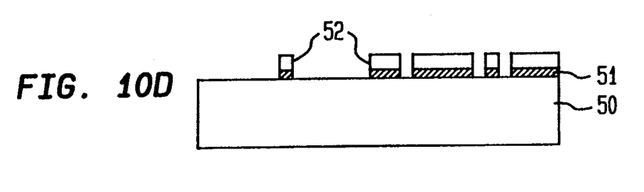

FIGS. 10A-10D shows a sequence for fabrication of a mask with uniform absorptive phase-shifting. A substrate 50 is coated with a transmissive absorber 51 (preferably chromium) which lies between the substrate 50 and the phase-shifting layer 52. Above phase-shifting layer 52 is photoresist layer 53, which is used to pattern layer 52 by the well known photolithographic process as shown in FIG. 10B. In FIG. 10C, absorber 51 serves as an etch-stop when using a conventional dry, reactive or plasma etching technique to delineate the phase-shifting layer 52, which can be any film transparent to the actinic light, e.g. silicon dioxide ($SiO_2$), spun-on-glass, silicon nitride ($Si_3Ni_4$), or PMMA resist. In the case of PMMA resist, the portable comformable masking technique of Lin (J Vac,. Sci. Technol. Vol 16, pp. 1669-1671 (1979) can be used to delineate the PMMA resist layer. In FIG. 10D, the delineated phase-shifting layer 52 has been used as an anistropic plasma etch mask to delineate the chromium layer 51.

Figure 11A:
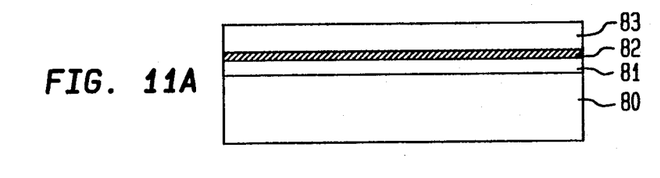
FIGS. 11A-11D show the fabrication process of a absorber-on-shifter Att PSM.
Figure 11B:
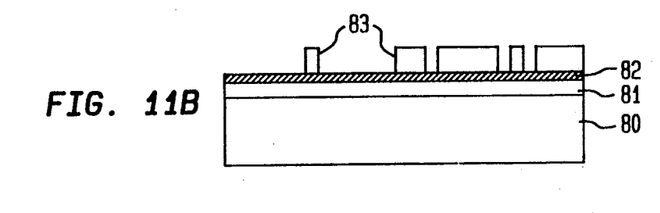
Figure 11C:
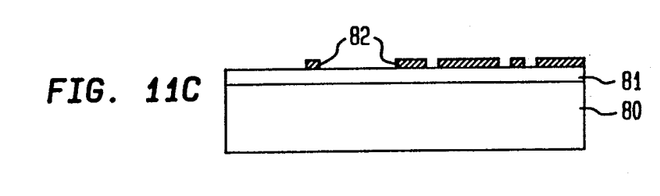
Figure 11D:
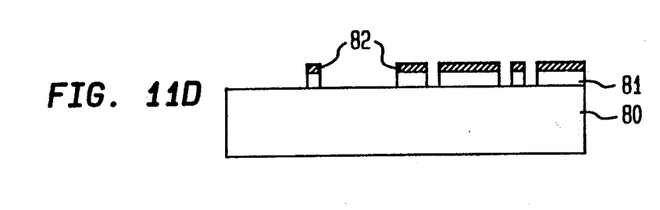

FIGS. 11A-11D show another sequence to fabricate a uniform absorptive phase-shifting mask. In this case, referring to FIG. 11A the chromium absorber layer 82 is above the phase-shifting layer 81 Resist layer 83 is on top of the absorber layer 82. Phase-shifting layer 81 is deposited directly upon the substrate 80. As a result, the phase-shifting layer 81 and the mask substrate 80 cannot be of an identical material, if the uniformity and the absolute thickness of the phase-shifting layer 81 cannot be well controlled. However, patterning of chromium absorber layer 82 is accomplish using conventional chromium imaging processes. In turn the chromium image formed in layer 82 as shown in FIG. 11C can serve as an etch mask for the phase-shifting layer 81, the result of which etching is shown in FIG. 11D. Silicon nitride ($Si_3N_4$) or Aluminum oxide ($Al_2O_3$) can be differentially etched with quartz which is usually the material of mask substrate 80. $Si_3N_4$ or $Al_2O_3$ is a good phase-shifting layer 81 for this configuration. They can also be used in the form of a thin etch stop separating the phase-shifting layer 81 from the mask substrate 80. If a polymer is used as a phase-shifting layer 81, a hardening step is preferred. It can be differentially etched by $O_2$ RIE.

A third way to fabricate an Att PSM, not shown in FIGS. 11A-11D is to use a substrate 80 with only a layer of transmissive absorber 82. The substrate 80 under the absorber openings is etched just as in FIG. 11D. However, because there is no etch stop, good etch uniformity and smooth finish are required.

Figure 12A:
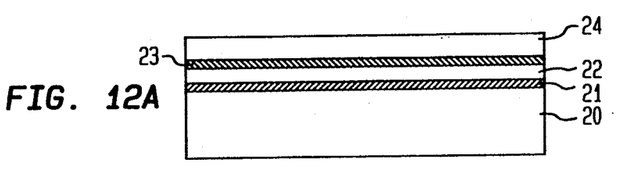
FIGS. 12A-12E show the fabrication process of an Att PSM containing small opaque features.
Figure 12B:
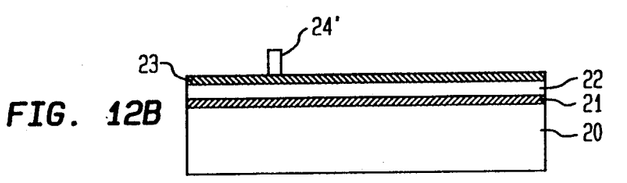
Figure 12C:
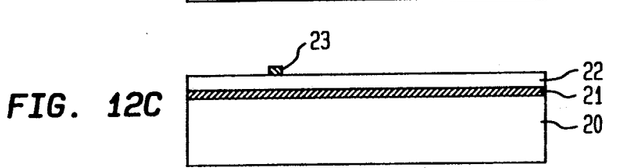
Figure 12D:
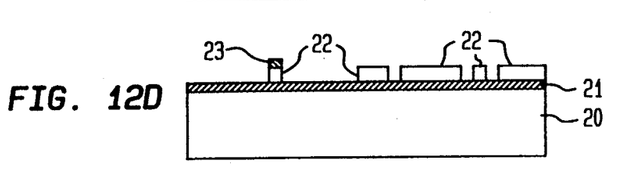
Figure 12E:
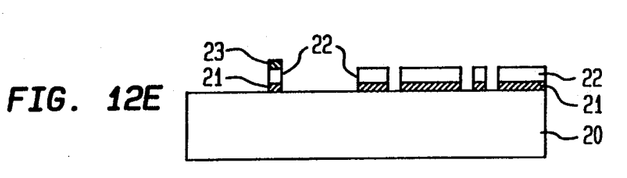

FIGS. 12A-E show a sequence including an opaque image on the structure of FIG. 10. In this case a mask substrate 20 is coated with a first transmissive absorber layer 21 (partially absorptive and partially transmissive), which in turn is coated with a first phase shifter layer 22, which in turn is coated with a second absorber layer 23, which is coated on top with a layer of photoresist 24. If FIG. 12B, the resist has been exposed and developed leaving a single resist rectangle 24'. The second absorber layer 23 which makes the transmission very low is delineated in FIG. 12C by conventional mask fabrication techniques. The delineation of the remaining layers follows the sequence of FIG. 10, except that the patterning exposure has to be aligned to the previous exposure to image the second absorber. Therefore, an alignment mark in the second absorber layer has to be provided. Alternately, the sequence of FIG. 11 can similarly be modified to include opaque images. In FIG. 12D the first phase shifter layer 22 is delineated after a second resist masking process (not shown) has been performed as is well understood by those skilled in the art. In FIG. 12E, the completed mask is shown after etching the first absorber layer 21.

Figure 13A:
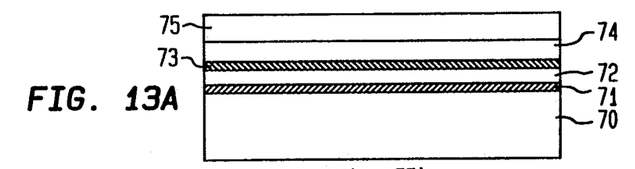
FIGS. 13A-13E show the fabrication process of an Att PSM containing more than one transmission level.
Figure 13B:
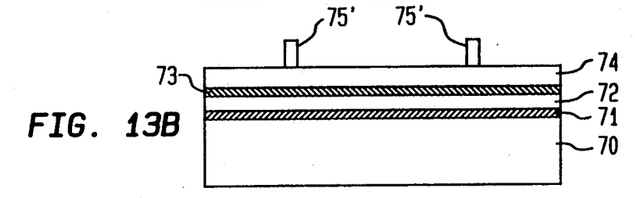
Figure 13C:
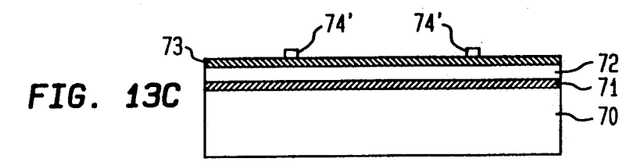
Figure 13D:
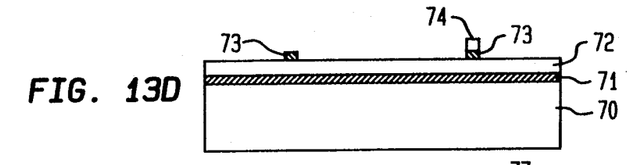
Figure 13E:
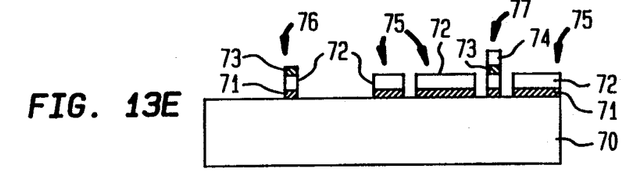

FIGS. 13A-E show a sequence to fabricate a mask with three levels of absorption. A mask substrate 70 is coated with a first transmissive absorber (partially absorptive and partially transmissive) layer 71, which in turn is coated with a first phase shifter layer 72, which in turn is coated with a second transmissive absorber (also partially absorptive) layer 73, which in turn is coated with a second phase shifter layer 74, which is coated on top with a layer of photoresist 75. In FIG.. 13B, the resist is developed leaving resist marks 75'. In FIG. 13C, the second phase shifter marks 74' are delineated. In FIG. 13D, the differentiated phase shifting is made after a second resist masking process (not shown) has been performed as is well understood by those skilled in the art. In FIG. 13E, the completed mask is made after a third resist masking process, also not shown. The resultant mask has attenuated phase shifted stacks 75, attenuated phase-shifted stack of a lower transmission at stack 76, and a stack 77 with similar transmission as stack 76 but no phase shift.

The resolution and the depth-of-focus limits of an optical projection imaging system is extended with biasing the features on a phase-shifting mask.

The attenuated phase-shifting mask shown in FIG. 6 achieves phase-shifting by making the conventional absorber slightly transmissive and a make-up phase-shifting layer is added to the absorber to make the phase-shift approximately $(2n+1)\pi$. As described above, a method of adjusting the exposure level of these windows comprises using a combination of opacity of the phase-shifting layers. In FIGS. 14-20, an additional means to adjust the exposure level is provided by changing the size of the pattern of the mask so that it is either smaller or larger than the nominal wafer image. The former case, applied to clear objects, is known as positive biasing and the latter, negative biasing. For opaque objects the sign convention of biasing is reversed.

Figure 14:
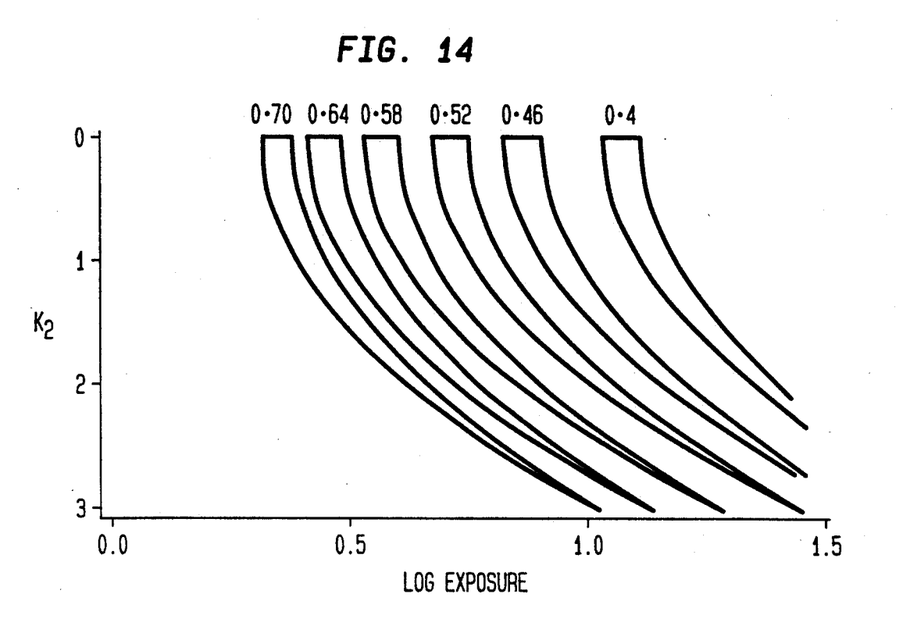
FIG. 14 shows the translation of the contact-hole E-D tree by biassing.
Figure 15:
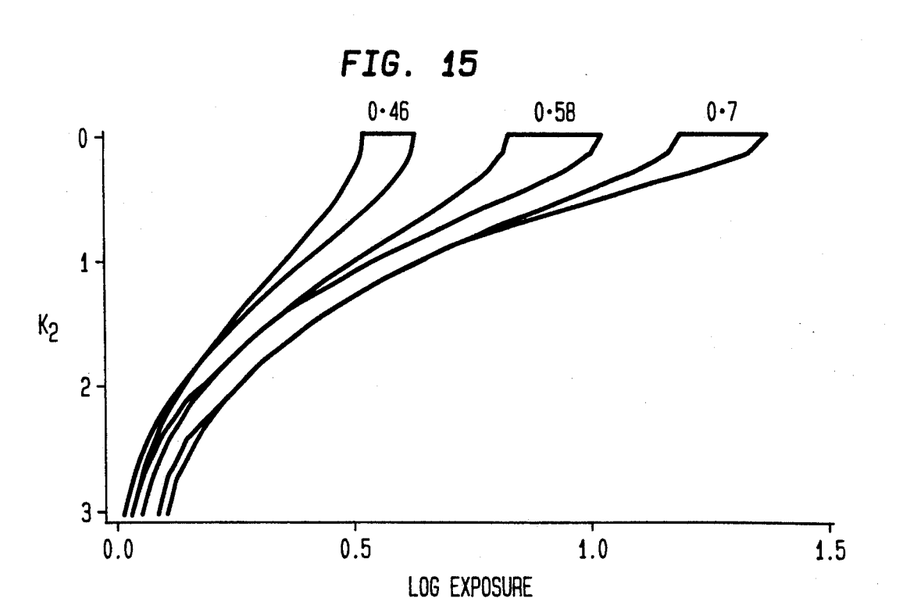
FIG. 15 shows the translation of the opaque-island E-D tree by biassing.

FIG. 14 depicts the effect of biassing contact holes to illustrate the effect of biasing to all clear objects. Here, the object sizes are $k_1 = 0.4, 0.46, 0.52, 0.58, 0.64$, and $0.7$ and the image size remains at $k_1 = 0.58 \pm 0.029$, after having been normalized by multiplying the feature size W and its tolerance Delta-W with NA/(L). The useable exposure-defocus (E-D) window changes its shape as well as its position on the exposure axis. Similarly, FIG. 15 shows the change of the E-D windows for opaque islands, with sizes 0.46, 0.58, and 0.7 to print a $0.58 \pm 0.058$ image.

Figure 16:
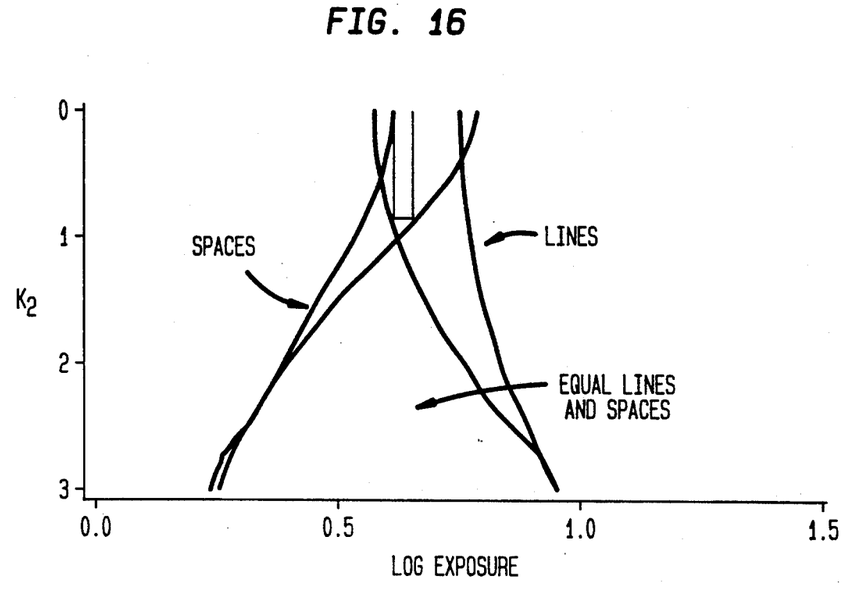
FIG. 16 shows a mask which is the result of biassing only the isolated opaque space in an Att PSM.

The three long features are used here as a representation of the extremes of packing density. On an actual mask, there is a large variety of packing density. The bias has to be adjusted accordingly. With long features, only the isolated opaque spaces have to be moved to a lower exposure level to create a large common E-D window, as shown in FIG. 16, in which a bias of $k_1 = 0.09$ for the isolated opaque spaces is used over the background of a uniform absorptive phase-shifting layer with 93.75% for absorption. The size of the equal lines and spaces and the isolated line openings remains at $k_1 = 0.46$, i.e. zero bias. Whereas $k_1$ becomes 0.37 for the isolated opaque spaces. The common region of these three features support a $k_2 = 0.87$ DOF with a 10% exposure latitude. Here the vertical dimension $k_2$ is normalized by multiplying with $NA2/((L))$.

Figure 17:
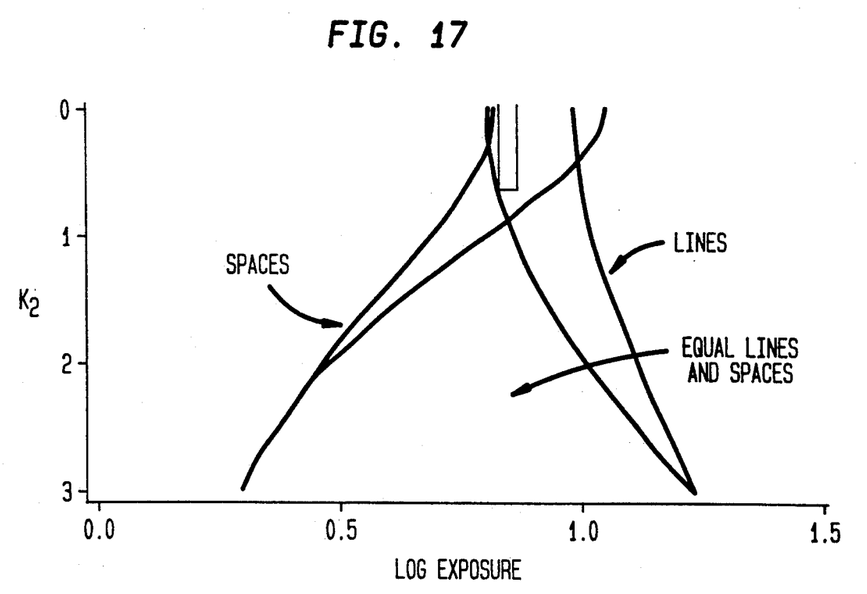
FIG. 17 shows a mask which is the result of biassing the line-space pairs and the line openings in an Att PSM.

Alternately, the bias of the equal lines and spaces and the isolated line opening can be adjusted while keeping the isolated opaques spaces at zero bias FIG. 17 shows $k_2=0.66$ DOF with the equal lines and spaces biassed to $k_1=0.38$ and the isolated line openings to $k_1=0.36$. Note that this combination is less desirable than the previous one, because as follows:

(1) Different biases have to be used for the two features, resulting in a higher level of difficulty to determine the bias for different proximity environments of the clear objects in a given circuit mask pattern.

(2) The exposure level is higher, resulting in a lower throughput.

(3) The DOF of the common window is smaller.

Figure 18:
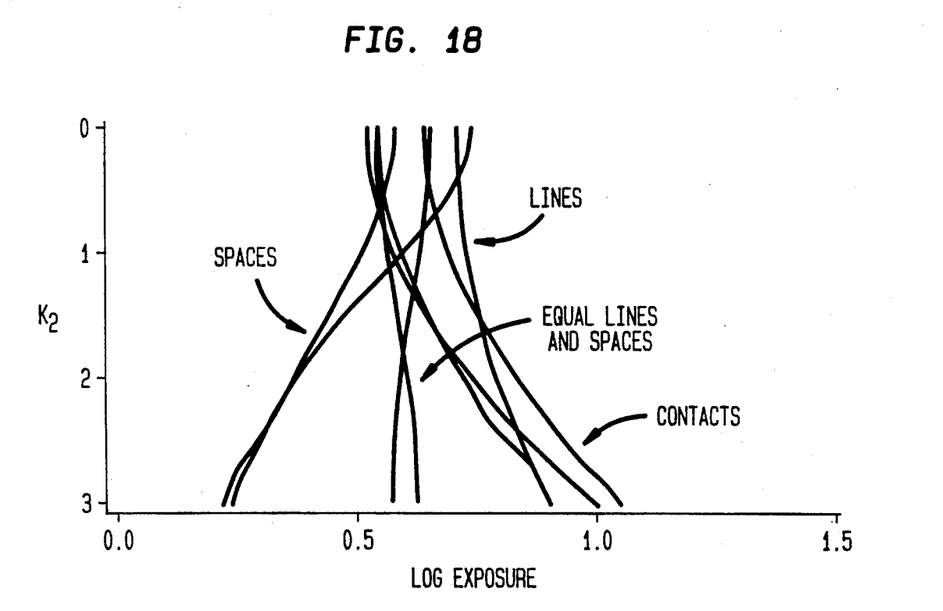
FIG. 18 adds biassed contact holes to the mask of FIG. 16.
Figure 19:
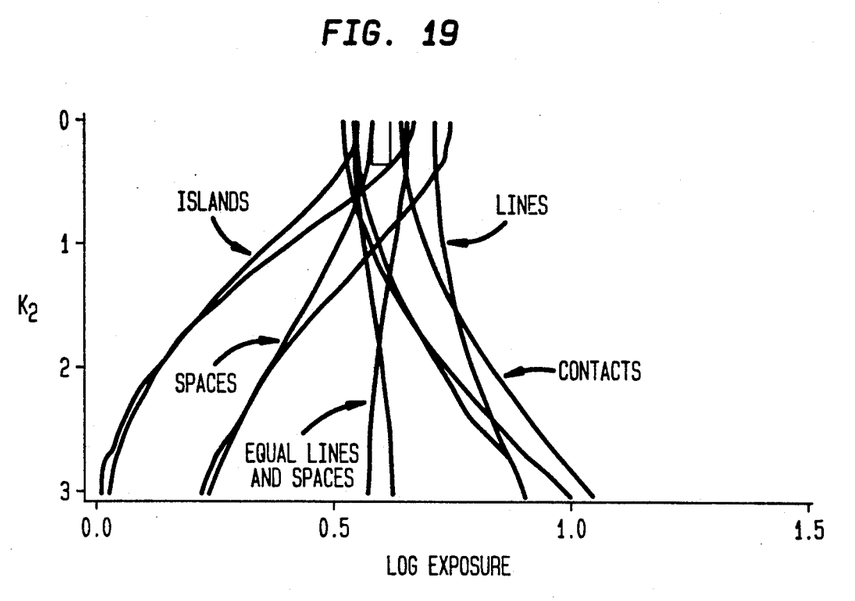
FIG. 19 adds biassed and more transmissive islands to the mask of FIG. 18.
Figure 20:
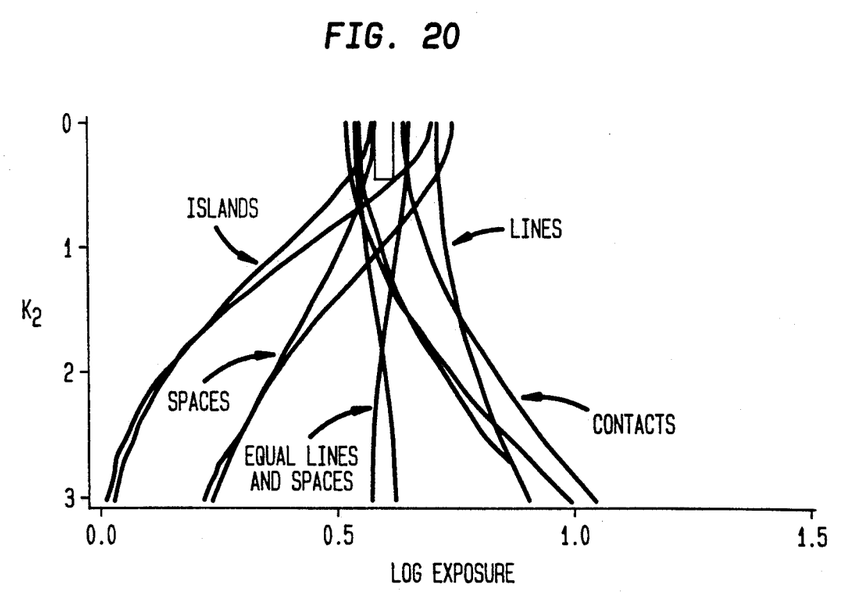
FIG. 20 adds biassed opaque islands to the mask of FIG. 18.

FIG. 18 shows that even if contact holes have to be included, they can be biassed to $k_1=0.58$ to maintain the same DOF. When opaque islands have to be included as well, they have to be biassed to $k_1=0.48$. The DOF is now 0.35 but still much better than without phase-shifting and biassing, as shown in FIGS. 19 and 20. The use of biassing is not limited to uniformly absorptive phase-shifting layers.

FIG. 20 shows that the transmission of the opaque islands can be increased to 12% from 6.25% to achieve a 0.46 $k_2$ DOF for the 5 features.

Figure 5:
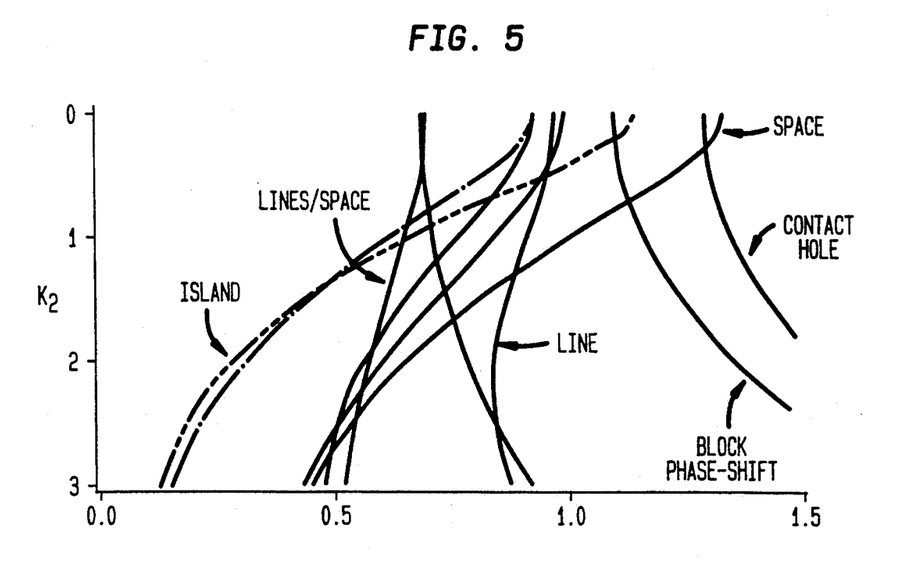
FIGS. 5 shows the Exposure-Defocus (E-D) tree of five feature types of the rim phase shifting design, illustrating that different features now require a larger difference in exposure to print the same feature size with an identical tolerance.

Furthermore, the use of biassing is not limited to attenuated phase-shifting. FIG. 5 shows that when the blocked phase-shifting system is unbiased, a common E-D window does not exist, even with a relatively high $k_1$ of 0.6. Biassing can bring all these windows together to produce a common window. The biasing technique can similarly improve the alternative-element, the sub-resolution phase-shifting systems, the rim phase shifting system, and the unattenuated phase-shifting system.

With respect to FIG. 16, a phase-shifting mask is provided where the isolated and densely populated long openings are kept at nominal dimensions. The isolated and less densely populate opaque long lines are made smaller than the nominal size. A larger deviation from nominal is used for lines of larger separations to other opaque features. These bias values are set to result in desirable image feature sizes on the wafer using a common exposure dosage for all features.

More generally, a phase-shifting mask is provided where the isolated and densely populated long openings are kept at an identical bias to the nominal dimension while the isolated and less densely populated opaque long liens have biasses different from those used for the openings. The mask feature size of these opaque features become s smaller as a function of the separation from other opaque features. These bias values are set to result in desirable image feature sizes on the wafer using a common exposure dosage for all features.

With respect to FIG. 18, a phase-shifting mask is provided which consists of short openings in addition to the features int eh mask of FIG. 16. The short openings are made larger than the long openings in FIG. 16. Smaller short openings receive larger adjustments than larger short openings. These bias values are set to result in desirable image feature sizes on the wafer using a common exposure dosage for all features.

With respect to FIG. 19, a phase-shifting mask is provided consisting of short opaque features in addition to the features in the mask of FIG. 18. The short opaque features are biassed to to result in desirable image feature sizes on the wafer using a common exposure dosage for all features.

In addition a phase-shifting mask identical to those of FIGS. 16, 18, 19 and 20 can be provided except that the bias for the isolated and densely populated clear openings is different.

What is claimed is:

1. A phase-shifting mask consisting of a composite pattern material disposed on a substantially transparent substrate and comprising a first sublayer of an absorptive non-opaque phase-shifting material having a predetermined absorption for incident radiation and a second sublayer of a substantially transmissive phase-shifting material, with openings in said composite pattern material permitting passage of radiation through said substrate, said absorptive and transmissive phase-shifting materials having predetermined thicknesses such that there is a relative phase shift of $\pi$ radians between radiation passing through said composite material, whereby radiation passing through said composite layer has a predetermined attenuation and a $\pi$ phase shift with respect to radiation passing through said opening 2. A phase-shifting mask according to claim 1 consisting of three levels of absorption; where the low absorption part is used on isolated short absorbing features smaller than a predetermined size.

3. A mask according to claim 1, in which said phase shift mask is a rim phase shift mask.

4. A mask according to claim 1, in which said phase shift mask is an alternative element phase shift mask.

5. A mask according to claim 1, in which said phase shift mask is a subresolution phase shift mask.

6. A mask according to claim 1, in which said phase shift mask is an unattenuated phase shift mask.

7. A mask according to claim 1, in which said phase shift mask is a rim phase shift mask.

8. A mask according to claim 1, in which said phase shift mask is an alternative element phase shift mask.

9. A mask according to claim 1, in which said phase shift mask is a subresolution phase shift mask.

10. A mask according to claim 1, in which said phase shift mask is an unattenuated phase shift mask.

11. A phase-shifting mask comprising an opaque and a partially transmissive phase-shifting layer disposed on respective portions of a transparent substrate and having predetermined openings therein permitting the passage of incident radiation through said openings and said substrate, said partially transmissive layer having a predetermined thickness such that there is a relative phase shift of $\pi$ radians between radiation passing through said openings and radiation passing through said partially transmissive material, whereby radiation passing through said partially transmissive layer has a predetermined attenuation and a $\pi$ phase shift with respect to radiation passing through said openings.

12. A phase-shifting mask according to claim 2, consisting of a mixture of opaque layers and partially transmissive phase-shifting layers, whereon said partially transmissive layer is used to define isolated long absorbing features.

13. A phase-shifting mask in accordance with claim 12 wherein the latter is used on isolated long absorbing features smaller than a redetermined size.

14. A phase-shifting mask according to claim 5, in which said partially transmissive layer is used to define isolated short absorbing features, and said opaque layer is used to define isolated long absorbing features.

15. A phase-shift mask for producing a pattern of wafer lines, wafer holes and wafer spaces having nominal wafer dimensions specified by predetermined ground rules in an optical resist on a wafer, comprising a transparent substrate and at least one absorbing layer disposed thereon, said absorbing layer having a pattern of openings permitting the passage of incident radiation therethrough, said absorbing layer further permitting the passage of part of said incident radiation with a phase shift of $\pi$ radians with respect to radiation passing through said openings, in which said openings and said absorbing layer comprise features selected from the classes of liens, spaces, combinations of lines and spaces, holes, and islands, each of which classes has associated with it at lest one nominal mask dimension characteristic of said class to provide a corresponding nominal ground rule wafer dimension characteristic of said class and each of which classes occupies a window in an E-D diagram, the overlap of which windows defines a common depth of focus and common exposure for said mask, characterized in that:

at least one of said classes has an altered nominal mask dimension different from an original nominal mask dimension such that said window in said E-D diagram corresponding to said at least one class is shifted to overlap at least one other window in said E-D diagram corresponding to at least one other class, whereby a common depth of focus and common exposure are established for said mask by said overlap and said class having an altered nominal mask dimension has a corresponding altered wafer dimension different from said nominal ground rule wafer dimension characteristic of said class.

16. A phase-shifting mask according to claim 15, further characterized in that:
a) isolated and densely populated long openings have said nominal dimensions,
b) isolated and less densely populated opaque long lines have an altered nominal mask dimension smaller than said nominal dimension for the class of opaque long lines.

17. A phase-shifting mask according to claim 16, further characterized in that:
c) said altered nominal mask dimensions of opaque lines become smaller as a function of the separation form other opaque features.

18. A phase-shifting mask in accordance with claim 17, further characterized in that:
a) short openings have an altered nominal mask dimension larger than the nominal mask dimension of long openings.

19. A mask according to claim 15, further characterized in that: said phase shift mask is a rim phase shift mask.

20. A mask according to claim 15, further characterized in that: said phase shift mask is an alternative-element phase shift mask.

21. A mask according to claim 15, further characterized in that: said phase shift mask is a subresolution phase shift mask.

22. A mask according to claim 15, further characterized in that: said phase shift mask is an unattenuated phase shift mask.

* * * * *